US012785739B2

(12) United States Patent
Denizoglu

(10) Patent No.: US 12,785,739 B2
(45) Date of Patent: Nov. 3, 2026

(54) RADIO SQUELCH CONTROL SYSTEM

(71) Applicant: Tusas—Turk Havacilik Ve Uzay Sanayii Anonim Sirketi, Kahramankazan (TR)

(72) Inventor: Tugce Denizoglu, Kahramankazan (TR)

(73) Assignee: Tusas—Turk Havacilik Ve Uzay Sanayil Anonim Sirketi, Kahramankazan (TR)

( * ) Notice: Subject to any disclaimer, the term of this patent is extended or adjusted under 35 U.S.C. 154(b) by 206 days.

(21) Appl. No.: 18/852,624

(22) PCT Filed: Mar. 28, 2023

(86) PCT No.: PCT/TR2023/050294
§ 371 (c)(1),
(2) Date: Sep. 30, 2024

(87) PCT Pub. No.: WO2023/191753
PCT Pub. Date: Oct. 5, 2023

(65) Prior Publication Data

US 2025/0219666 A1 Jul. 3, 2025

(30) Foreign Application Priority Data

Mar. 31, 2022 (TR) ............................... 2022/004992

(51) Int. Cl.
*H04B 1/10* (2006.01)
*H03G 3/34* (2006.01)

(52) U.S. Cl.
CPC ........... *H04B 1/1027* (2013.01); *H03G 3/341* (2013.01)

(58) Field of Classification Search
CPC . H03G 3/34; H03G 3/341; H04B 1/10; H04B 1/1027
See application file for complete search history.

(56) References Cited

FOREIGN PATENT DOCUMENTS

| | | |
|---|---|---|
| JP | 09-162762 | 6/1997 |
| JP | 09-312580 | 12/1997 |
| JP | 2002-043972 | 2/2002 |
| JP | 2008-113351 | 5/2008 |
| WO | WO 93/03551 | 2/1993 |

OTHER PUBLICATIONS

International Search Report and the Written Opinion Dated Sep. 18, 2023 From the International Searching Authority Re. Application No. PCT/TR2023/050294. (16 Pages).

*Primary Examiner* — Tuan H Nguyen

(57) ABSTRACT

This invention relates to at least one channel (2) in a radio, an operation mode (3) enabling data to be transmitted through the channel (2) by means of radio signals, a squelch setting (4) that cuts off signals at a level below a manufacturer-predetermined threshold in the channel (2) when it is switched on and transmits all signals in the channel (2) when it is switched off, a memory (5) that stores the squelch setting (4) for each channel (2), and a processor (6) that processes the data in the memory (5) and applies the squelch setting (4) to the signals transmitted over the channel (2).

12 Claims, 2 Drawing Sheets

RADIO SQUELCH CONTROL SYSTEM

RELATED APPLICATIONS

This application is a National Phase of PCT Patent Application No. PCT/TR2023/050294 having International filing date of Mar. 28, 2023, which claims the benefit of priority of Turkey Patent Application No. 2022/004992 filed on Mar. 31, 2022. The contents of the above applications are all incorporated by reference as if fully set forth herein in their entirety.

FIELD AND BACKGROUND OF THE INVENTION

This invention relates to an algorithm enabling an automatic squelch setting to be made in a radio communication system.

In telecommunications, a squelch circuit is used to reduce or suppress unwanted signals and the noise caused thereby. With the squelch function, which can be switched on or off by the user, those signals below a desired level are muted and those signals above a desired level are transmitted to a headset. When the squelch function is switched off, every sound is transmitted to the headset, and when it is switched on, sounds above a certain decibel (db) level are transmitted to the headset. Switching the squelch function on and off can be done manually or automatically. Performing this function manually adds to the workload of the pilot and may cause an incorrect switching on or off to be made.

In the Japanese patent document JP2002043972A, which is included in the known state of the art, a transmission start switch and a PTT (push to talk) switch are connected to a CPU that controls an entire radio device. The CPU is connected to a memory. Said memory has a first squelch control signal that is read when the transmission is started by switching on the PTT switch, and a second squelch control signal that is read when the transmission is started by switching on the second transmission start switch. The squelch control signal is stored. The first and second squelch control signals have different frequencies or digital codes so that the squelcher can be controlled according to a common station of two stations having different squelch control signals. The first and second squelch control signals are stored in memory in the form of digital data.

In the U.S. patent document WO9303551A1, which is included in the known state of the art, a controller automatically controls the operation of a squelch circuit. The settings of the squelch circuit are stored in a memory block and the operation of the squelch circuit is controlled by means of the controller. The information contained in a memory includes threshold hysteresis used by the squelch circuit to prevent instability. To enable a manual control of the squelch circuit, an optional manual squelch control can be connected to the controller. The manual squelch control enables the squelch circuit to be manually set to certain levels desired by the user.

The Japanese paten document JP109312580A discusses a squelch level setting method for portable wireless devices, particularly mobile radios, aimed at enhancing audio output by reducing noise during weak signal reception. The system monitors the received signal strength and adjusts the audio output using either preset squelch levels or user-defined inputs stored in memory. It explains the system's circuit design including the CPU, detectors, and input controls, which work together to enable efficient squelch level adjustment, improving both the user experience and device performs across various signal environments.

Similarly ese patent document JPH09162762A outlines a noise suppression method for mobile radios by adjusting the audio output based on the strength of received signals. The method compares signal strength data with either predefined or user-adjusted squelch levels stored in memory. Key components like a demodulator, audio signal processor (ASP), A/D converters, and CPU are used to manage the audio output, ensuring noise control. This method also streamlines the device's hardware, enhancing its flexibility to adjust squelch levels according to the surrounding conditions.

In another Japanese patent document JP2008113351A, introduces a system that dynamically controls the squelch levels in portable wireless devices based on environmental noise and user input. The device features two squelch operation modes—high sensitivity and normal—each associated with different threshold voltages for regulating the audio output. This system reduces audio disruptions in noisy settings and optimizes functionality by automatically storing squelch data in memory. It also details the components, such as filters, detectors, amplifiers, and control units, that manage the noise control process effectively.

With a radio squelch control system developed with this invention, it is enabled to automatically perform a squelch setting to be made in radios used in air, sea and land vehicles, to prevent the user from performing an incorrect switching on/off, and to reduce the workload of the user.

Thanks to the radio squelch control system, an automatic squelch adjustment is ensured such that squelching is not switched off when it should be switched on and that squelching is not switched on when it should be switched off, and any communication disruptions are prevented.

The radio squelch control system realized to achieve the object of the invention, as defined in the first claim and in the claims dependent thereon, comprises an operation mode that is one of the AM (amplitude modulation), FM (frequency modulation), or HQ (have quick) modes that enable the channels in a radio to transmit radio signals. AM data change the amplitude of the carrier signal, FM data change the frequency of the carrier signal, and HQ transmits the data in an encrypted form. When the squelch setting for the channel is switched on, the signals below a user-defined level (decibel level) are cut off or dampened. When the squelch setting for the channel is switched off, all signals are transmitted. It contains a memory that stores the squelch setting for the channel and a processor that reads the squelch setting for the channel from the memory and assigns it to the channel.

A radio squelch control system according to the invention includes a processor that enables to detect the operation mode, which is any one of the AM, FM or HQ modes, that the channel uses to transmit data at that moment, and to control the squelch setting of the channel by automatically assigning to the channel the squelch setting in the memory that gives the highest match to the detected operation mode. The squelch setting assigned to the channel and the operation mode of the channel are matched by the processor and stored in the memory. Thus, a squelch array is created in the memory for the next automatic assignments.

In an embodiment of the invention, the radio squelch control system comprises a processor that matches the user's squelch setting and the channel's operation mode and stores it in the memory when the squelch setting is selected manually by the user.

Thus, in order to automatically implement the squelch setting for the channel, the processor enables data to be gathered and a learning process to be realized using more sampling data. In an embodiment of the invention, the radio squelch control system comprises a processor that executes an artificial intelligence algorithm, enabling a squelch setting, which is automatically assigned to or manually selected by the user for the channel, to be matched to the operation mode of the channel, and creating a squelch array in the memory. The artificial intelligence algorithm stores the matched operation mode and squelch setting for each channel in the created squelch array. Artificial intelligence learning is implemented by these operations. The artificial intelligence algorithm detects the operation mode of the channel and enables the mostly repeated squelch setting (ON or OFF) in the squelch array to be assigned to the channel for the detected operation mode. Thus, an automatic selection is made and an incorrect squelch setting as a result of user selections is prevented.

In an embodiment of the invention, the radio squelch control system comprises a processor that assigns AM to the channel as the operation mode when the channel set manually by the user does not have an operation mode. Thus, an automatic squelch setting can be assigned to the channel according to the operation mode, and in a step wherein the user enters the squelch setting, the matched operation mode and squelch setting are stored in the memory so that sampling can be performed with more data.

In an embodiment of the invention, the radio squelch control system comprises a processor executing an artificial intelligence algorithm that matches the operation mode of the channel manually set by the user, the squelch setting input by the user, and the frequency band of the channel and stores it in the squelch array in the memory. The frequency band is the range in which the frequency used by the channel at that moment is present, which is obtained by dividing the frequency range in which the radio provides communication by a user-determined number or range. The frequency band data to which the channel is paired by the processor after detecting its frequency is matched with the operation mode and squelch setting information and stored in the squelch array to be used for artificial intelligence learning. Thus, the artificial intelligence algorithm executed by the processor is enabled to perform a sampling operation using more data.

In an embodiment of the invention, the radio squelch control system comprises a processor executing an artificial intelligence algorithm that enables the detection of the operation mode and the frequency band for the channel manually set by the user.

The squelch setting of the channels using a detected operation mode and frequency band is assigned by the artificial intelligence algorithm executed by the processor according to the mostly repeated squelch setting within the squelch array. For example, it is determined by the processor executing the artificial intelligence algorithm that the channel manually entered by the user has an AM operation mode and a fifth frequency band. There are ten channels that use the AM operation mode. There are four channels that use the AM operation mode and the fifth frequency band. Within the scope of this example, the most repeated squelch setting by four channels is assigned to the channel by artificial intelligence.

In cases where the operation mode detected for the channel is used, but there is no channel in the squelch array in the frequency band detected for the channel, the most repeated squelch setting in the squelch array according to the operation mode is assigned by the processor executing the artificial intelligence algorithm. For example, it is detected by the processor executing the artificial intelligence algorithm that the channel manually entered by the user has an AM operation mode and a fifth frequency band. There are ten channels that use the AM operation mode. However, there is no channel that uses the fifth frequency band. With reference to this example, the most repeated squelch setting in ten channels that use the AM operation mode in the squelch array is assigned to the channel by the processor executing the artificial intelligence. In cases where the operation mode and frequency band detected for the channel are used, but there is an equal number of squelch settings for the frequency band in the squelch array, the most repeated squelch setting in the squelch array according to the operation mode is selected by the processor executing the artificial intelligence algorithm. For example, it is detected by the processor executing the artificial intelligence algorithm that the channel manually entered by the user has an AM operation mode and a fifth frequency band. There are ten channels that use the AM operation mode. There are four channels that use the AM operation mode and the fifth frequency band. Squelch settings in the form of two ONs and two OFFs for four channels are available in the squelch array. Within the scope of this example, the most repeated squelch setting in ten channels that use the AM operation mode in the squelch array is assigned to the channel by the processor executing the artificial intelligence.

When there is no channel that uses the operation mode detected for the channel, but there are channels that use the frequency band detected for the channel, the most repeated squelch setting in the squelch array according to the frequency band is assigned by the processor executing the artificial intelligence algorithm. For example, it is detected by the processor executing the artificial intelligence algorithm that the channel manually entered by the user has an AM operation mode and a fifth frequency band. There is no channel that uses the AM operation mode. In this case, there are four channels that use the fifth frequency band. Within the scope of this example, the most repeated squelch setting by four channels is assigned to the channel by artificial intelligence. When there is an equal number of squelch settings in the squelch array and there are channels in the frequency bandwidth range for the channels that use the operation mode detected for the channel, the most repeated squelch setting in the squelch array according to the frequency band is assigned by the processor executing the artificial intelligence algorithm. For example, it is detected by the processor executing the artificial intelligence algorithm that the channel manually entered by the user has an AM operation mode and a fifth frequency band. There are ten channels that use the AM operation mode, and squelch settings in the form of five ONs and five OFFs for ten channels are available in the squelch array. Within the scope of this example, the most repeated squelch setting in four channels having the fifth frequency band in the squelch array is assigned to the channel by the processor executing the artificial intelligence.

When the most repeated squelch settings are equal according to the operation mode and frequency band detected for the channel, the ON setting as the squelch setting is assigned to the channel by the artificial intelligence. For example, it is detected by the processor executing the artificial intelligence algorithm that the channel manually entered by the user has an AM operation mode and a fifth frequency band. There are ten channels that use the AM operation mode, and squelch settings in the form of five ONs and five OFFs for ten channels are available in the squelch array. There are four channels that use the AM operation mode and the fifth frequency band. Squelch settings in the form of two ONs and two OFFs for four channels are available in the squelch array. There are six channels that use only the fifth frequency band. Squelch settings in the form of three ONs and three OFFs for six channels are available in the squelch array. Within the scope of this example, an ON setting as a squelch setting is assigned to the channel by artificial intelligence.

The squelch setting assigned to the channel by the processor executing the artificial intelligence, and the channel's operation mode and frequency band information are also stored in the squelch array.

In an embodiment of the invention, the radio squelch control system comprises a processor which executes an artificial intelligence algorithm that detects the operation mode of the channel and enables the most repeated squelch setting in the squelch array for the detected operation mode to be assigned to the channel when a channel loaded in the radio is used for the first time. Thus, a squelch setting is automatically assigned. When the repeated squelch settings are equal according to the operation mode in the squelch array, an ON setting as the squelch setting is assigned to the channel by the artificial intelligence algorithm. The squelch setting, operation mode and channel number assigned to the channel are stored in the squelch array in the memory by the processor executing the artificial intelligence algorithm. Thus, the automatically assigned squelch setting enables the sampling data for artificial intelligence training to be increased.

In an embodiment of the invention, the radio squelch control system envisages the squelch setting of the channel available in the radio, but to be used for the first time to be made by the user, and storing the user-made squelch setting, the operation information of the channel and the channel number in the squelch array in the memory by means of the processor executing the artificial intelligence algorithm. When the radio is first switched on for the channel loaded in the radio and used for the first time, the artificial intelligence algorithm assigns an automatic squelch setting and the assigned squelch setting, the channel's operation mode and the channel number are stored in a data array. However, if the squelch setting is changed manually by the user, the information of the automatic squelch setting assignment is deleted from the squelch array. The squelch setting set manually by the user, the channel's operation mode and the channel number are stored in the data array.

In an embodiment of the invention, the radio squelch control system comprises a processor that enables the squelch setting to be assigned according to the channel number and the previously-used squelch setting information stored for that channel in the memory when a channel is present in the radio to which a squelch setting was already assigned since it was used previously. When the user manually changes the squelch setting for the channel, the previous channel number and the squelch setting information are deleted from the memory and the user-assigned squelch setting and the channel number information are stored in the memory by the processor.

In an embodiment of the invention, the radio squelch control system comprises a processor-managed monitor that enables to display the squelch setting assigned to the channel by the person using the radio or set by the user for the channel.

In an embodiment of the invention, the radio squelch control system comprises a processor that executes an artificial intelligence algorithm that enables an automatic squelching to be made for the channel when the channel is used for the first time or when the manual channel is set. However, there is a button provided on the monitor so that the automatic squelch setting can be changed by the user. Thanks to the button, the user can make a choice instead of an automatic selection.

In an embodiment of the invention, the radio squelch control system comprises a processor that enables the squelch setting of a radio in air, sea or land vehicles to be made.

BRIEF DESCRIPTION OF SEVERAL VIEWS OF THE DRAWINGS

The radio squelch control system realized to achieve the object of the present invention is shown in the attached figures, wherein.

DESCRIPTION OF SPECIFIC EMBODIMENTS OF THE INVENTION

Figure 1:
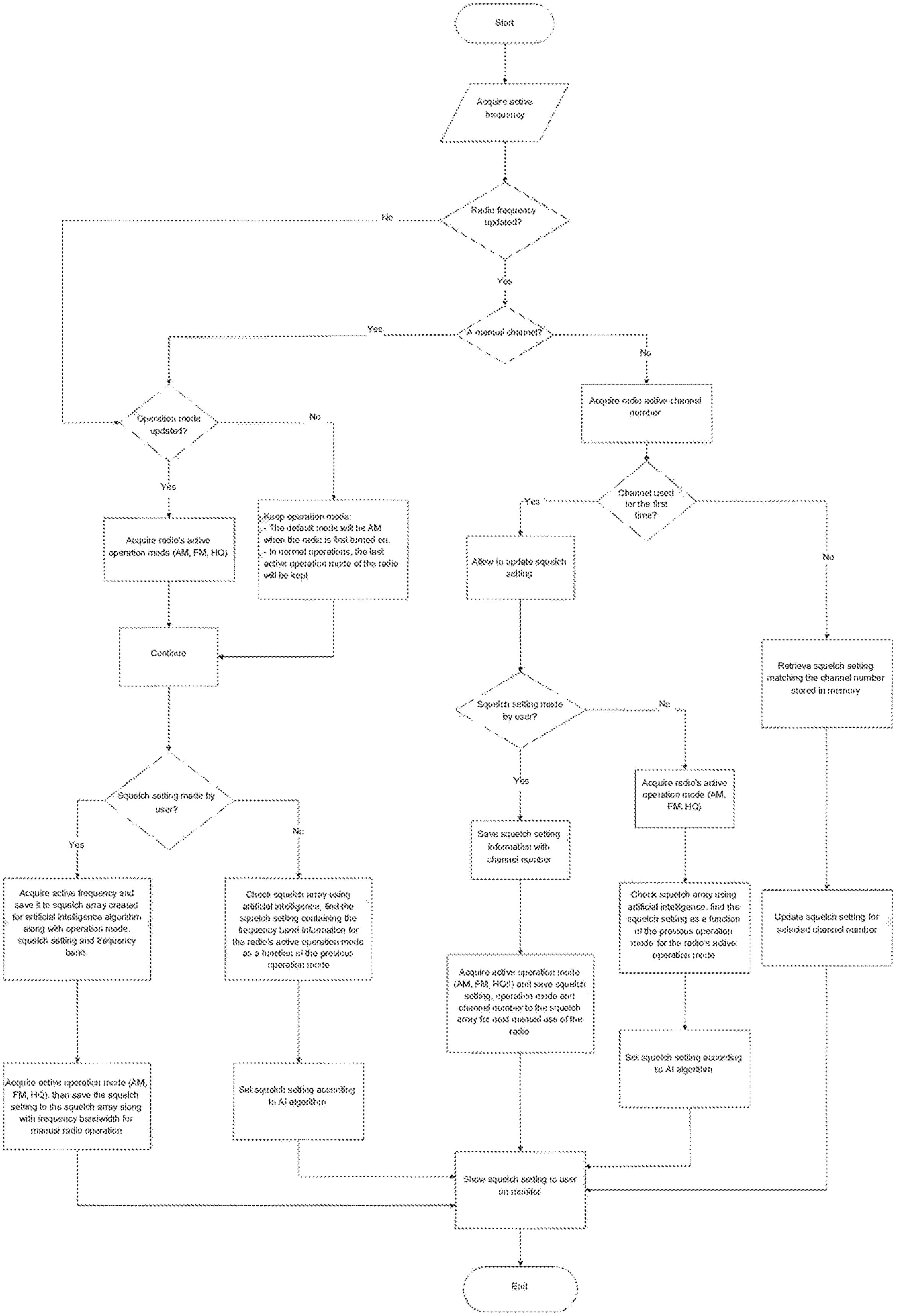
FIG. 1 is a flow diagram of a radio squelch control system.

The parts illustrated in figures are individually assigned a reference numeral and the corresponding terms of these numbers are listed below.

1. Radio squelch control system
2. Radio signal
3. Operation Mode
4. Squelch Setting
5. Memory
6. Processor
7. Squelch Array
8. Monitor
9. Button The radio squelch control system (1) comprises at least a radio signal (2), an operation mode (3) for enabling data to be transmitted through a channel by means of radio signals (2), a squelch setting (4) configured to cut off radio signals (2) at a level below a manufacturer-predetermined threshold in the channel when it is switched on and to transmit all radio signals (2) in the channel when it is switched off, a memory (5) for storing the squelch setting (4) for each radio signal (2), and a processor (6) for processing the data in the memory (5) and applying the squelch setting (4) to the radio signals (2) transmitted over the channel.

Figure 2:
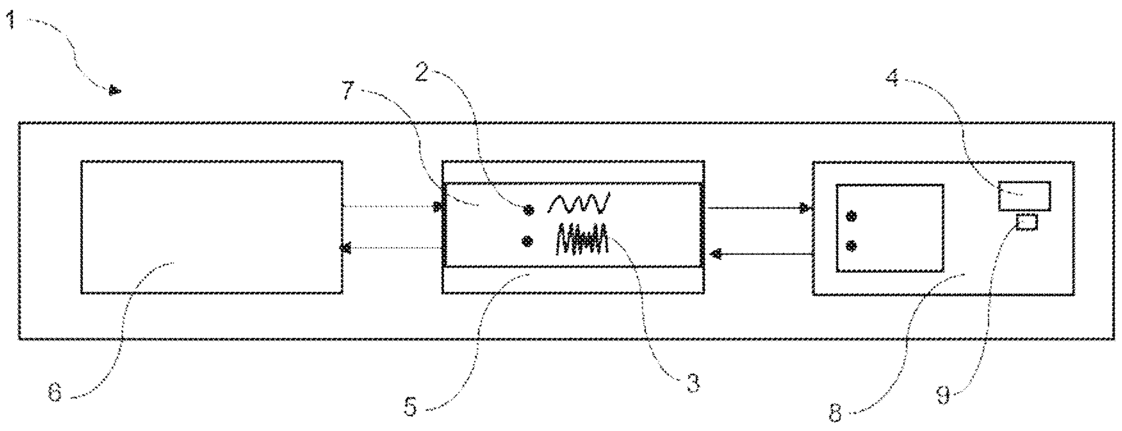
FIG. 2 is a block diagram for the processor, memory, and monitor.

The radio squelch control system (1) of the invention comprises a processor (6) configured to detect the operation mode (3) of the radio signal (2) and to enable the most repeated squelch setting (4) in the memory (5) for the detected operation mode (3) to be automatically assigned, and enable the squelch setting (4) to be matched with the operation mode (3) and stored in the memory (5) (FIG. 1, FIG. 2).

The radio signal (2) set by the user or saved on the radios comprises an operation mode (3) that enables the radio signal (2) to transmit by anyone of the AM, FM or HQ modes. When the squelch setting (4) is ON, the signals transmitted through the radio signal (2) below a user-defined decibel level are reduced or muted, and when the squelch setting (4) is OFF, all the radio signals (2) transmitted through the channel pass through. The squelch setting (4) is stored in the memory (5) for the channels (2) and when the radio signal (2) is used, the processor (6) applies the squelch setting (4) to the radio signal (2).

The operation mode (3) that is possessed by the radio signal (2) or assigned to the radio signal (2) is detected by the processor, and according to the detected operation mode (3), the most repeated squelch setting (4) in the memory (5) is applied to the radio signal (2). The squelch setting (4) automatically assigned by the processor (6) to the radio signal (2) according to the operation mode (3), and the operation mode (3) information are stored in the memory (5). Thus, the number of samples in the memory (5) for the processor (6) to make the next automatic squelch setting (4) selection increases. With the increase in the number of samples, the accuracy of the next automatic squelch setting (4) assignment increases.

In an embodiment of the invention, the radio squelch control system (1) comprises a processor (6) that matches the operation mode (3) of the radio signal (2) and the squelch setting (4) selected by the user and stores it in the memory (5) when the squelch setting (4) for the radio signal (2) is entered manually by the user. The squelch setting (4) of the radio signal (2) can be selected manually by the user or the current squelch setting (4) of the radio signal (2) can be changed by the user. The squelch setting (4) selected by the user and operation mode (3) for the radio signal (2) are matched and stored in the memory (5). When the current squelch setting (4) for the radio signal (2) is changed by the user, the previous squelch setting (4) and the operation mode (3) match are deleted from the memory (5) and the squelch setting (4) selected by the user and operation mode (3) match is stored in the memory (5). Thus, in cases where the squelch setting (4) is automatically made, data is stored in the memory (5) for use in the automatic decision making of the radio squelch control system (1).

In an embodiment of the invention, the radio squelch control system (1) comprises a processor (6) that executes an artificial intelligence algorithm that matches the information on the squelch setting (4) made by the user or automatically assigned to the radio signal (2) with the information on the operation mode (3) of the radio signal (2) and stores it in the memory (5) so as to create a squelch array (7), detects the operation mode (3) for the radio signal (2) and enables the squelch setting (4) that is most repeated in the squelch array (7) for the detected operation mode (3) to be assigned to the radio signal (2), matches the squelch setting (4) with the operation mode (3) and enables it to be stored in the squelch array (7). When the radio is first switched on, the processor (6) that is configured to process the artificial intelligence algorithm assigns a squelch setting (4) to the radio signal (2), the latter being a manually-selected radio signal (2) or a radio signal (2), that is stored in the radio, but has not been used before. The operation mode (3) is detected by the processor (6) that executes the artificial intelligence algorithm for the manually-selected radio signal (2) or for the channel stored in the radio, but has not been used before. For the detected operation mode (3), the most repeated squelch setting (4) in the squelch array (7) is assigned to the radio signal (2) by the processor (6) executing the artificial intelligence algorithm. This squelch setting (4) assigned by the processor (6) executing the artificial intelligence algorithm and the operation mode (3) of the radio signal (2) are matched by the processor (6) executing the artificial intelligence algorithm and stored in the memory (5) in the squelch array (7). The user can then manually change the squelch setting (4) selected by the artificial intelligence algorithm for the manually-selected radio signal (2) or the radio signal (2) stored in the radio but not used before.

In this case, the processor (6) executing the artificial intelligence algorithm removes the matching information of the squelch setting (4) assigned automatically by itself to the radio signal (2) and the operation mode (3) of the radio signal (2) from the squelch array (7) in the memory (5), and matches the squelch setting (4) manually selected by the user and operation mode (3) and stores it in the squelch array (7) in the memory (5). Before the data on the matching of the operation mode (3) and the squelch setting (4) in the squelch array (7) in the memory (5) are created, the squelch setting (4) for the radio signal (2) must be entered manually by the user so that artificial intelligence learning is implemented (FIG. 1).

In an embodiment of the invention, the radio squelch control system (1) comprises a processor (6) that assigns an AM mode as the operation mode (3) when the radio is first switched on, if the operation mode (3) is not active for the radio signal (2) entered manually by the user. If the radio signal (2) is manually set by the user and does not have any operation mode (3), the processor (6) automatically assigns AM to the radio signal (2).

In an embodiment of the invention, the radio squelch control system (1) comprises a processor (6) that execute an artificial intelligence algorithm that stores the operation mode (3) of the radio signal (2) entered manually by the user, the squelch setting (4) made by the user, and the frequency bandwidth of the radio signal (2) when the radio signal (2) entered manually by the user has an operation mode (3), so that a squelch array (7) is created in the memory (5).

When the squelch setting (4) of the radio signal (2) entered manually by the user is also made by the user, the operation mode (3) of the radio signal (2) is detected by the artificial intelligence algorithm executed by the processor (6). The squelch setting (4) selected by the user for the radio signal (2), the operation mode (3) and the frequency band information of the frequency of the radio signal (2) are stored in the squelch array (7) in the memory (5) by the processor (6) executing the artificial intelligence algorithm. The entire frequency range that the radio can communicate with is fragmented into 1 to n parts according to a user-determined number by the artificial intelligence algorithm executed by the processor (6) and frequency bands are created. The artificial intelligence algorithm executed by the processor (6) detects the frequency of the radio signal (2), and matches the information on the frequency band that the frequency corresponds to and the information on the user-selected squelch setting (4) and the operation mode (3) of the goal signal (2) and stores this match in the squelch array (7). For example, for the frequency bands of the radio with a frequency range of 200-512 MHz, which is divided into 6 parts at 50 MHz intervals; the processor (6) executing the artificial intelligence algorithm detects the frequency band of the radio signal (2) to be in the first frequency band when the frequency of the radio signal (2) is between 200-250 MHz, in the second frequency band when the frequency of the radio signal (2) is between 250-300 MHz, in the third frequency band when the frequency of the radio signal (2) is between 300-350 MHz, in the forth frequency band when the frequency of the radio signal (2) is between 350-400 MHz, in the fifth frequency band when the frequency of the radio signal (2) is between 400-450 MHz, and in the sixth frequency band when the frequency of the radio signal (2) is between 450-512 MHz.

In an embodiment of the invention, the radio squelch control system (1) comprises a processor (6) that executes an artificial intelligence algorithm that implements at least one of the steps of detecting the operation mode (3) and the frequency band of the radio signal (2) entered manually by the user;

- assigning to the radio signal (2) the squelch setting (4) in the most repeated squelch array (7) in the channels (2) using the detected operation mode (3) and in the channels (2) within the frequency band,
- assigning to the radio signal (2) the most repeated squelch setting (4) only according to the operation mode (3) when there is no squelch setting (4) match according to the detected frequency band of the radio signal (2) in the squelch array (7), or when the most repeated squelch settings (4) according to the frequency band are equal,
- assigning to the radio signal (2) the most repeated squelch setting (4) only according to the frequency band when there is no squelch setting (4) match according to the detected operation mode (3) of the radio signal (2) in the squelch array (7), or when the most repeated squelch settings (4) according to the operation mode (3) are equal,
- assigning ON as the squelch setting (4) when the most repeated squelch settings (4) according to the operation mode (3) and according to the frequency band in the squelch array (7) are equal, and matching the squelch setting (4), the operation mode (3), and the frequency band and storing it in the squelch array (7) in the memory (5). The operation mode (3) and the frequency band of the radio signal (2) entered manually are detected by the processor (6) executing the artificial intelligence algorithm. The most repeated squelch setting (4) in the squelch array (7) is assigned to the radio signal (2) by the artificial intelligence algorithm executed in the processor (6) according to the operation mode (3) and the frequency band. For example, when it is detected that the manually-set radio signal (2) uses the AM operation mode (3) and is in the fifth frequency band by the artificial intelligence algorithm executed by the processor (6); if the squelch setting (4) is matched in three channels (2) as ON and in seven channels (2) as OFF for ten channels (2) with AM operation mode (3) in the squelch array (7), and if three of ten channels (2) with AM operation mode (3) remain in the fifth frequency band, if the squelch setting (4) for three channels (2) is matched in two channels (2) as ON and in one radio signal (2) as OFF, the squelch setting (4) is assigned to the radio signal (2) as ON in this example by the processor (6) executing the artificial intelligence algorithm. Based on this example, the data on the AM operation mode (3), the fifth frequency band and the ON setting as the squelch setting (4) for that radio signal (2) are matched by the artificial intelligence algorithm and stored in the squelch array (7). For example, when it is detected that the manually-set radio signal (2) uses the AM operation mode (3) and is in the fifth frequency band by the artificial intelligence algorithm executed by the processor (6); if the squelch setting (4) is matched as ON in three channels (2) and as OFF in seven channels (2) for ten channels (2) with AM operation mode (3) in the squelch array (7), and if none of ten channels (2) with AM operation mode (3) matches with the fifth frequency band, the squelch setting (4) is assigned as OFF to the radio signal (2) in this example by the processor (6) executing the artificial intelligence algorithm. Based on this example, the data on the AM operation mode (3), the fifth frequency band and the OFF setting as the squelch setting (4) for that radio signal (2) are matched by the artificial intelligence algorithm and stored in the squelch array (7) (FIG. 1).

In an embodiment of the invention, the radio squelch control system (1) comprises a processor (6) that detects the operation mode (3) of the radio signal (2) and assigns to the radio signal (2) the most selected squelch setting (4) for the detected operation mode (3) in the squelch array (7) when a radio signal (2) loaded in the radio and to be used for the first time is selected, and if the user does not make any squelch setting (4). When the radio signal (2) loaded in the radio is used for the first time, the squelch setting (4) is automatically assigned by the processor (6) executing the artificial intelligence algorithm. The processor (6) executing the artificial intelligence algorithm detects the operation mode (3) of the radio signal (2) and applies to the radio signal (2) the most repeated squelch setting (4) for the detected operation mode (3) in the squelch array (7).

The automatically assigned squelch setting (4) and the operation mode (3) for the radio signal (2) are matched and stored in the squelch array (7) by the processor (6), so that artificial intelligence learning is implemented for the next automatic squelch setting (4) assignment (FIG. 1).

In an embodiment of the invention, the radio squelch control system (1) comprises a processor (6) that executes an artificial intelligence algorithm that stores the user-made squelch setting (4), the radio signal (2) number, and the operation mode (3) in the squelch array (7) when a radio signal (2) loaded in the radio and is to be used for the first time is selected. When the radio signal (2) in the radio is used for the first time, the squelch setting (4) is automatically assigned to the radio signal (2) by the artificial intelligence algorithm executed by the processor (6), based on the most repeated squelch setting (4) according to the operation mode (3) of the radio signal (2). However, when this automatic squelch setting (4) assignment is changed by the user, the artificial intelligence algorithm executed in the processor (6) removes the previous operation mode (3) and the squelch setting (4) match from the squelch array (7) and stores the user-selected squelch setting (4), the radio signal (2) number and the operation mode (3) in the squelch array (7).

Thus, artificial intelligence learning is implemented for the next automatic squelch setting (4) assignment.

In an embodiment of the invention, the radio squelch control system (1) comprises a processor (6) that reads the squelch setting (4) used for the radio signal (2) from the memory (5) and assigns it to the radio signal (2) when a radio signal (2) loaded in the radio and is previously used is selected by the user. It comprises a processor (6) that reads the match of the squelch setting (4) selected or automatically assigned in the previous use of the radio signal (2) and the radio signal (2) number from the memory (5) when the radio signal (2) is previously used, and enables the squelch setting (4) matched with the radio signal (2) number to be used for the next uses of the radio signal (2).

For the previously used radio signal (2), when the radio signal (2) is reused, the assignment of the processor (6) that automatically assigns to the radio signal (2) the squelch setting (4) corresponding to the radio signal (2) number from the memory (5) can also be changed manually by the user. When the squelch setting (4) for the radio signal (2) is changed by the user, the radio signal (2) number and the newly set squelch setting (4) are matched and stored in the memory (5), and the squelch setting (4) is assigned according to this match in the next use of the radio signal (2).

In an embodiment of the invention, the radio squelch control system (1) comprises a monitor (8) that enables the squelch setting (4) to be displayed to the user and is managed by the processor (6). There is a monitor (8) managed by the processor (6) to show the user the squelch setting (4) selections made by the user, or the squelch settings (4) automatically assigned by the artificial intelligence algorithm.

In an embodiment of the invention, the radio squelch control system (1) comprises a processor (6) that executes an artificial intelligence algorithm that enables the squelch setting (4) to be made automatically when the radio is first switched on, and a button (9) on the monitor (8) so that the squelch setting (4) can be changed by the user after the processor (6) has made the squelch setting (4) for the radio signal (2). When the radio is first switched on by the user, the squelch setting (4) for the manually-set radio signal (2), or for the radio signal (2) present in the radio but not used before is carried out by the processor (6) that executes the artificial intelligence algorithm. However, the user can change the automatically assigned squelch setting (4) thanks to the button (9) on the monitor (8). In this case, the data related to the automatic squelch setting (4) are deleted from the squelch array (7) and the data related to the user's squelch setting (7) selection are stored in the squelch array (7). (FIG. 2)

In an embodiment of the invention, the radio squelch control system (1) comprises a squelch setting (4) that enables the noise of the radio radio signal (2) in air, sea and land vehicles to be filtered.

The invention claimed is:

1. A radio squelch control system (1) comprising at least a radio signal (2), an operation mode (3) for enabling data to be transmitted through a channel by means of radio signals (2), a squelch setting (4) configured to cut off radio signals (2) at a level below a manufacturer-predetermined threshold in the channel when it is switched on and to transmit all radio signals (2) in the channel when it is switched off, a memory (5) for storing the squelch setting (4) for each radio signal (2), and a processor (6) for processing the data in the memory (5) and applying the squelch setting (4) to the radio signals (2) transmitted over the channel, characterized in that the processor (6) is configured to detect the operation mode (3) of the radio signal (2) and to enable the most repeated squelch setting (4) in the memory (5) for the detected operation mode (3) to be automatically assigned, and to enable the squelch setting (4) to be matched with the operation mode (3) and stored in the memory (5).

2. A radio squelch control system (1) according to claim 1, wherein the processor (6) is configured to match the operation mode (3) of the radio signal (2) with the user-selected squelch setting (4) and to store it in the memory (5), when the squelch setting (4) for the radio signal (2) is entered manually by the user.

3. A radio squelch control system (1) according to claim 1, wherein the processor (6) is configured to execute an artificial intelligence algorithm that matches the information on the squelch setting (4) made by the user or automatically assigned to the radio signal (2) with the information on the operation mode (3) of the radio signal (2) and stores it in the memory (5) so as to create a squelch array (7), detects the operation mode (3) for the radio signal (2) and enables the squelch setting (4) that is most repeated in the squelch array (7) for the detected operation mode (3) to be assigned to the radio signal (2), matches the squelch setting (4) with the operation mode (3) and stores it in the squelch array (7).

4. A radio squelch control system (1) according to claim 3, wherein the processor (6) is configured to execute an artificial intelligence algorithm that stores the operation mode (3) of the radio signal (2) entered manually by the user, the squelch setting (4) made by the user, and the frequency bandwidth of the radio signal (2) so that a squelch array (7) is created in the memory (5), when the radio signal (2) entered manually by the user has an operation mode (3).

5. A radio squelch control system (1) according to claim 3, wherein the processor (6) is configured to execute an artificial intelligence algorithm that implements at least one of the steps of detecting the operation mode (3) and the frequency band of the radio signal (2) entered manually by the user;

- assigning to the radio signal (2) the squelch setting (4) in the most repeated squelch array (7) in radio signals (2) using the detected operation mode (3) and in radio signals (2) within the frequency band,
- assigning to the radio signal (2) the most repeated squelch setting (4) only according to the operation mode (3) when there is no squelch setting (4) match according to the detected frequency band of the radio signal (2) in the squelch array (7), or when the most repeated squelch settings (4) according to the frequency band are equal,
- assigning to the radio signal (2) the most repeated squelch setting (4) only according to the frequency band when there is no squelch setting (4) match according to the detected operation mode (3) of the radio signal (2) in the squelch array (7), or when the most repeated squelch settings (4) according to the operation mode (3) are equal,
- assigning ON as the squelch setting (4) when the most repeated squelch settings (4) according to the operation mode (3) and according to the frequency band in the squelch array (7) are equal, and matching the squelch setting (4), the operation mode (3), and the frequency band and storing it in the squelch array (7) in the memory (5).

6. A radio squelch control system (1) according to claim 3, wherein the processor (6) is configured to execute an artificial intelligence algorithm that detects the operation mode (3) of the radio signal (2) and assigns to the radio signal (2) the most selected squelch setting (4) for the detected operation mode (3) in the squelch array (7) when a radio signal (2) loaded in the radio and to be used for the first time is selected, and if the user has not made any squelch squelch (4).

7. A radio squelch control system (1) according to claim 3, wherein the processor (6) is configured to execute an artificial intelligence algorithm that stores the user-made squelch setting (4), the radio signal (2) number, and the operation mode (3) in the squelch array (7) when a radio signal (2) loaded in the radio and to be used for the first time is selected.

8. A radio squelch control system (1) according to claim 1, wherein if the operation mode (3) is not active for the radio signal (2) entered manually by the user, the processor (6) assigns an AM mode as the operation mode (3) when the radio is switched on for the first time.

9. A radio squelch control system (1) according to claim 1, wherein the processor (6) is configured to read the squelch setting (4) used for the radio signal (2) from the memory (5) and to assign it to the radio signal (2) when a previously used radio signal (2) loaded in the radio is selected by the user.

10. A radio squelch control system (1) according to claim 1, further comprising a monitor (8) which is configured to enable the squelch setting (4) to be displayed to the user and managed by the processor (6).

11. A radio squelch control system (1) according to claim 10, wherein the processor (6) is configured to execute an artificial intelligence algorithm that enables a squelch setting (4) to be made automatically when the radio is first switched on, and a button (9) on the monitor (8) that enables the squelch setting (4) to be changed by the user after the processor (6) makes the squelch setting (4) for the radio signal (2).

12. A radio squelch control system (1) according to above claim 1, wherein the squelch setting (4) is configured to enable the noise of a radio signal (2) in air, sea and land vehicles to be filtered.

* * * * *